United States Patent
Fukumoto et al.

(10) Patent No.: US 7,474,382 B2
(45) Date of Patent: Jan. 6, 2009

(54) METHOD FOR DETERMINING FOCUS DEVIATION AMOUNT IN PATTERN EXPOSURE AND PATTERN EXPOSURE METHOD

(75) Inventors: Hirofumi Fukumoto, Toyama (JP); Naohiko Ujimaru, Tonami (JP); Ken-ichi Asahi, Imizu-gun (JP); Fumio Iwamoto, Ikoma (JP)

(73) Assignee: Panasonic Corporation, Osaka (JP)

( * ) Notice: Subject to any disclaimer, the term of this patent is extended or adjusted under 35 U.S.C. 154(b) by 474 days.

(21) Appl. No.: 10/558,163

(22) PCT Filed: May 28, 2004

(86) PCT No.: PCT/JP2004/007732

§ 371 (c)(1),
(2), (4) Date: Nov. 23, 2005

(87) PCT Pub. No.: WO2005/001912

PCT Pub. Date: Jan. 6, 2005

(65) Prior Publication Data

US 2006/0285098 A1 Dec. 21, 2006

(30) Foreign Application Priority Data

May 29, 2003 (JP) ............................. 2003-153019
Oct. 6, 2003 (JP) ............................. 2003-346831

(51) Int. Cl.
*G03B 27/52* (2006.01)
*G03B 27/42* (2006.01)
(52) U.S. Cl. .......................................... 355/55; 355/53
(58) Field of Classification Search ................... 355/53, 355/55, 77; 250/492.2; 438/7
See application file for complete search history.

(56) References Cited

U.S. PATENT DOCUMENTS 4,908,656 A 3/1990 Suwa et al.

(Continued)

FOREIGN PATENT DOCUMENTS

JP 62-122125 6/1987

(Continued)

*Primary Examiner*—Peter B. Kim
(74) *Attorney, Agent, or Firm*—Hamre, Schumann, Mueller & Larson, P.C.

(57) ABSTRACT

A plurality of first measurement patterns each including a protruding pattern formed of a resist film and a recessed pattern having a space with a shape corresponding to the protruding pattern are formed on a first substrate such that they have different focus values at a time of exposure, edge inclination amounts of the plurality of first measurement patterns are measured, and a focus dependence (17) of the edge inclination amounts is obtained based on correspondences (7) and (14) between the edge inclination amounts and the focus values. A second measurement pattern including the protruding pattern and the recessed pattern is formed on a second substrate so as to measure edge inclination amounts of the second measurement pattern, and a focus deviation amount deviating from a best focus at the time of exposure of the second measurement pattern is calculated from the edge inclination amounts of the second measurement pattern based on the focus dependence of the edge inclination amounts. A dimension of the protruding pattern and a dimension of the space of the recessed pattern are set to be different so that best focus values at the time of exposing the protruding pattern and the recessed pattern become closer.

22 Claims, 14 Drawing Sheets

U.S. PATENT DOCUMENTS

| | | |
|---|---|---|
| 5,650,840 A * | 7/1997 | Taniguchi .................... 355/55 |
| 6,791,096 B2 | 9/2004 | Komuro et al. |
| 6,869,807 B2 | 3/2005 | Yoshitake et al. |

FOREIGN PATENT DOCUMENTS

| | | |
|---|---|---|
| JP | 6-026833 | 2/1994 |
| JP | 10-154647 | 6/1998 |
| JP | 63-261836 | 10/1998 |
| JP | 2001-230323 | 8/2001 |
| JP | 2003-59813 | 2/2003 |

* cited by examiner

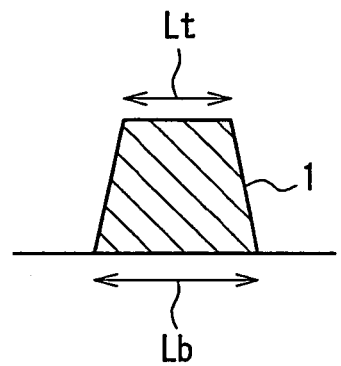
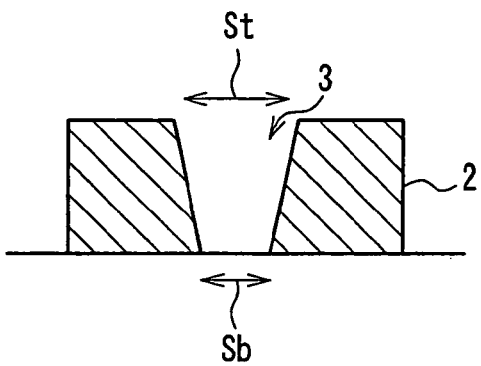
FIG. 1A      FIG. 1B
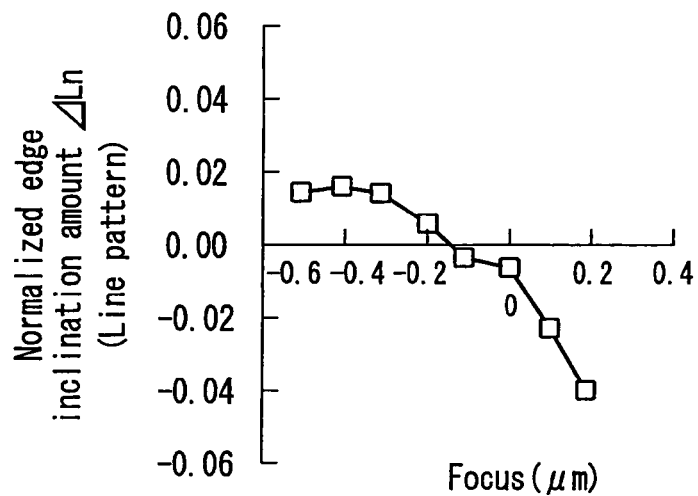
FIG. 2A
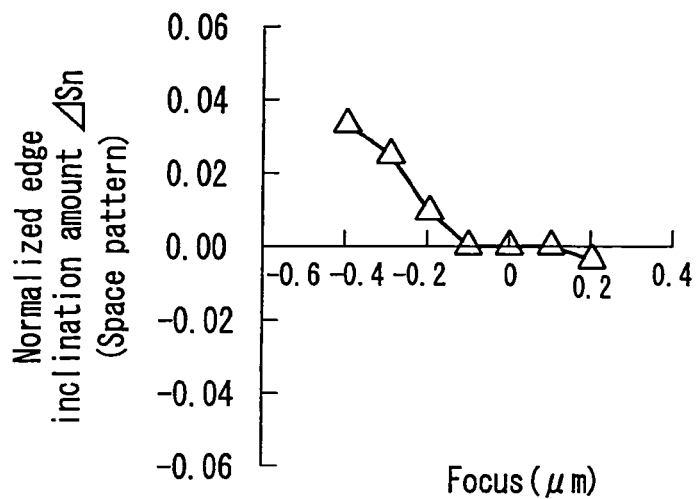
FIG. 2B

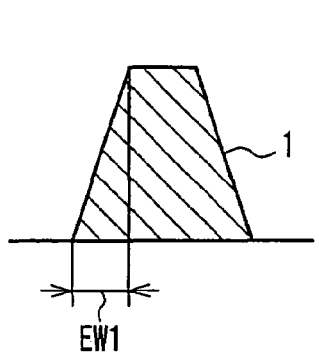
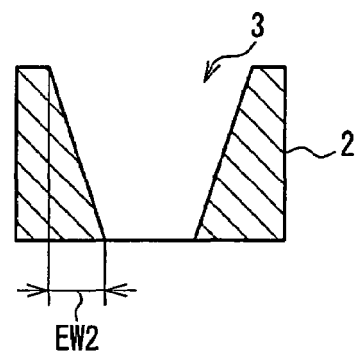
FIG. 19A
FIG. 19B
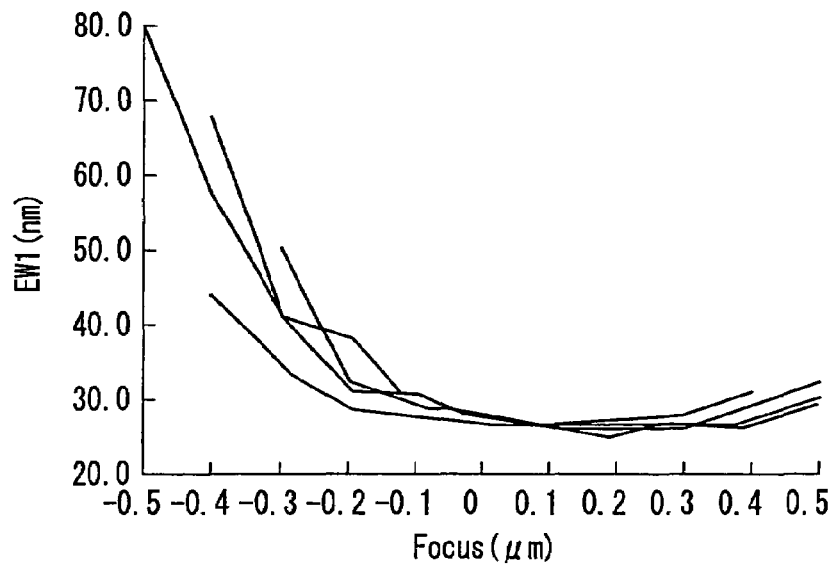
FIG. 20A
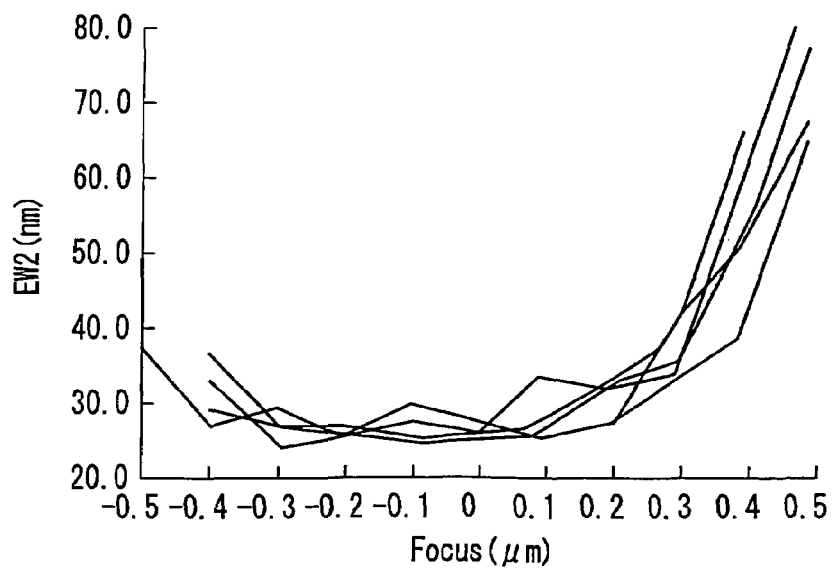
FIG. 20B

US 7,474,382 B2

METHOD FOR DETERMINING FOCUS DEVIATION AMOUNT IN PATTERN EXPOSURE AND PATTERN EXPOSURE METHOD

TECHNICAL FIELD

The present invention relates to a method for determining a focus deviation amount in pattern exposure with respect to a resist film. Also, the present invention relates to a method for extracting the focus dependence of an edge inclination amount of a pattern used for that determining method. Further, the present invention relates to a method for carrying out a pattern exposure with respect to a resist film while performing a focus correction.

BACKGROUND ART

When forming a minute resist pattern on a resist film on a semiconductor wafer by lithography, the focus position at the time of pattern exposure greatly influences the dimensional accuracy of the resist pattern. Thus, at the start of construction of a new process, wafers printed with patterns by changing focus values of exposing equipment are produced per unit exposure, and the dimension of the formed resist patterns is measured, thus setting the best focus value for obtaining a predetermined pattern dimension.

However, because of various process variations, it is unlikely that the best focus value that has been set can be used forever to obtain the resist pattern with a predetermined dimension. Therefore, in a conventional technology, a focus deviation has been corrected according to the variation in an optimal position of focusing caused by the process variation. For doing this, it is necessary to determine the focus deviation amount deviating from the optimal position. JP 2003-59813 A describes a method for determining such a focus deviation amount. This method will be explained with reference to FIGS. 19A, 19B, 20A, 20B and 21.

FIG. 19A shows a cross-section of a line pattern 1 formed of a resist remaining in a linear form. FIG. 19B shows a cross-section of a space pattern 2 having a space 3 that remains after removing a resist partially in a linear form. These resist patterns are used for observing how the shape of the formed patterns varies when shifting a focus at the time of pattern exposure using a mask in a positive direction and a negative direction from a best focus value. Here, the positive side of the focus value refers to a state in which a focus is achieved on a side below the best focal point, and the negative side of the focus value refers to a state in which a focus is achieved on a side above the best focal point.

The variation in the shape of the line pattern 1 and the space pattern 2 described above with respect to the focus variation becomes notable in the inclination amount of end faces of the pattern (in the following, referred to as an edge inclination amount). Now, EW1 denotes the edge inclination amount of the line pattern 1 shown in FIG. 19A, and EW2 denotes that of the space pattern 2 shown in FIG. 19B. With their horizontal axes indicating the focus value and their vertical axes indicating the edge inclination amounts EW1 and EW2, FIGS. 20A and 20B show lines indicating the focus dependence of the edge inclination amount, namely, a variation in the edge inclination amount with respect to the variation in the focus value. Each line corresponds to a measurement result obtained by each of exposures with different exposure amounts. The focus value 0 corresponds to the best focus.

As shown in FIG. 20A, the edge inclination amount EW1 of the line pattern varies notably when the focus is shifted from the best focal point in the negative direction. On the other hand, as shown in FIG. 20B, the edge inclination amount EW2 of the space pattern hardly varies when the focus is shifted from the best focal point in the negative direction but varies notably when the focus is shifted to the positive side. From these edge inclination amounts EW1 and EW2, a model showing a focus dependence of the edge inclination amount can be formulated as shown in FIG. 21. In other words, by obtaining the difference between EW1, which varies on the negative side, and EW2, which varies on the positive side, i.e., EW1—EW2, it is possible to obtain a curve showing the characteristics of the variation in the edge inclination amount with respect to the variation in the focus value. Using this curve, a focus deviation amount can be determined from the correspondence with the edge inclination amount.

However, as becomes clear from FIG. 21, there is a region in which the value of the vertical axis (EW1-EW2) remains flat near the best focus value (=0 μm). Thus, with this method, the focus deviation amount cannot be determined accurately near the best focus value.

The formation of this flat region is attributable to two factors. First, the resolutions of the line pattern and the space pattern are different in the current resist. Usually, the focus is achieved on the line pattern, but this causes the space pattern to be out of focus. In other words, the best focus values of the line pattern and the space pattern do not match. For example, the best focus value of a 0.18 μm line pattern does not match with that of a 0.18 μm space pattern.

Second, there is a dimensional error in manufacturing masks. In a factory where plural types of products are produced, masks are manufactured for each type. When manufacturing plural kinds of masks, dimensional errors occur inevitably. Such dimensional errors of the masks result in a problem that the best focus values of the line pattern and the space pattern do not match.

DISCLOSURE OF INVENTION

It is an object of the present invention to provide a method for determining a focus deviation amount capable of detecting accurately the deviation amount of a focus from a desired position in pattern exposure with respect to a resist film. It is another object of the present invention to provide an exposure method conducted while correcting a focus position using this determining method.

A method for determining a focus deviation amount according to the present invention includes forming on a first substrate a plurality of first measurement patterns, each including a protruding pattern with a predetermined shape formed of a resist film and a recessed pattern having a space with a shape corresponding to the protruding pattern, the plurality of first measurement patterns having different focus values at a time of exposure, measuring edge inclination amounts of the protruding pattern and the recessed pattern in the plurality of first measurement patterns, obtaining a focus dependence of the edge inclination amounts, which is a characteristic showing how the edge inclination amounts vary with respect to a variation in the focus value at the time of exposure, based on correspondences between the measured edge inclination amounts and the focus values, forming on a second substrate a second measurement pattern including the protruding pattern and the recessed pattern so as to measure edge inclination amounts of the protruding pattern and the recessed pattern in the second measurement pattern, and calculating a focus deviation amount deviating from a best focus at the time of exposure of the second measurement pattern from the edge inclination amounts measured with respect to the second measurement pattern based on the focus dependence of the edge inclination amounts. A dimension of the protruding pattern and a dimension of the space of the recessed pattern are set to be different so that best focus values at the time of exposing the protruding pattern and the recessed pattern become closer.

A method for extracting a focus dependence of an edge inclination amount according to the present invention includes forming on a substrate a plurality of measurement patterns, each including a protruding pattern with a predetermined shape formed of a resist film and a recessed pattern having a space with a shape corresponding to the protruding pattern, the plurality of measurement patterns having different focus values at a time of exposure, measuring edge inclination amounts of the protruding pattern and the recessed pattern in the plurality of measurement patterns, and obtaining a focus dependence of the edge inclination amounts, which is a characteristic showing how the edge inclination amounts vary with respect to a variation in the focus value at the time of exposure, based on correspondences between the measured edge inclination amounts and the focus values. A dimension of the protruding pattern and a dimension of the space of the recessed pattern are set to be different so that best focus values at the time of exposing the protruding pattern and the recessed pattern become closer.

A pattern exposure method according to the present invention includes forming on a first substrate a plurality of first measurement patterns, each including a protruding pattern with a predetermined shape formed of a resist film and a recessed pattern having a space with a shape corresponding to the protruding pattern, the plurality of first measurement patterns having different focus values at a time of exposure, measuring edge inclination amounts of the protruding pattern and the recessed pattern in the plurality of first measurement patterns, obtaining a focus dependence of the edge inclination amounts, which is a characteristic showing how the edge inclination amounts vary with respect to a variation in the focus value at the time of exposure, based on correspondences between the measured edge inclination amounts and the focus values, forming on a second substrate a second measurement pattern including the protruding pattern and the recessed pattern at predetermined focus values so as to measure edge inclination amounts of the protruding pattern and the recessed pattern in the second measurement pattern, calculating a focus deviation amount deviating from a best focus at the time of exposure of the second measurement pattern from the edge inclination amounts measured with respect to the second measurement pattern based on the focus dependence of the edge inclination amounts, and performing a pattern exposure with respect to a resist film on a third substrate at a focus value obtained by correcting the calculated focus deviation amount. A dimension of the protruding pattern and a dimension of the space of the recessed pattern are set to be different so that best focus values at the time of exposing the protruding pattern and the recessed pattern become closer.

BRIEF DESCRIPTION OF DRAWINGS

FIGS. 1A and 1B are sectional views showing patterns for determining a focus deviation amount;

FIGS. 2A and 2B show variations in edge inclination amounts;

FIGS. 19A and 19B are sectional views showing conventional patterns for determining a focus deviation amount;

FIGS. 20A and 20B show variations in conventional edge inclination amounts; and

DESCRIPTION OF THE INVENTION

Figure 3:
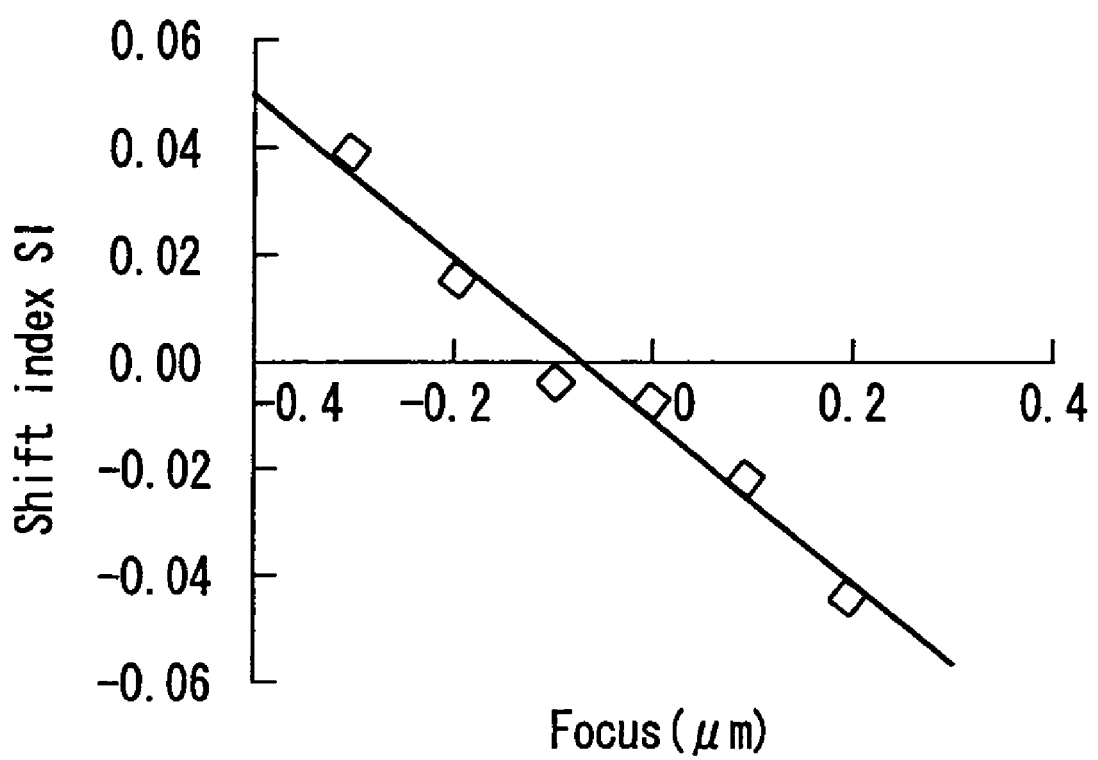
FIG. 3 shows a shift index with respect to a focus variation.

In accordance with the present invention, the dimension of the protruding pattern and the dimension of the space of the recessed pattern are made different so that the best focus values at the time of exposing the respective patterns become closer, making it possible to suppress the formation of the flat part near the best focus value in the characteristic combined with the focus dependence of the respective edge inclination amounts. Consequently, a focus deviation amount also can be detected near the best focus value.

In the method for determining a focus deviation amount or a pattern exposure method according to the present invention, it is preferable that normalized edge inclination amounts are obtained respectively for the protruding pattern and the recessed pattern in the plurality of first measurement patterns by subtracting values of the edge inclination amounts at the best focus values from values of the edge inclination amounts at the respective focus values, the normalized edge inclination amounts obtained for the protruding pattern and the recessed pattern are combined to prepare a shift index showing a correspondence with the focus value at the time of exposure, and the shift index is used as the focus dependence of the edge inclination amounts.

In this configuration, it is preferable that the shift index is modified by correcting a shift of the correspondence between the normalized edge inclination amounts and the focus value at the time of exposure caused by a dimensional error of an exposure mask for forming the protruding pattern and the recessed pattern with respect to a design value.

In the method for determining a focus deviation amount, the method for extracting a focus dependence of an edge inclination amount or the pattern exposure method according to the present invention, a line pattern formed of the resist film remaining in a linear form can be used as the protruding pattern, and a space pattern having a space remaining after removing the resist film in a linear form can be used as the recessed pattern.

Also, a dot pattern formed of the resist film remaining in a dotted form can be used as the protruding pattern, and a hole pattern having a space remaining after removing the resist film in a dotted form can be used as the recessed pattern.

Further, the edge inclination amounts can be measured by measuring a top dimension, which is a dimension at a top surface position of the resist film, and a bottom dimension, which is a dimension at a bottom surface position thereof, and calculating a difference between the top dimension and the bottom dimension for each of the protruding pattern and the recessed pattern.

Now, the principle of a method for determining a focus deviation amount used in the present invention will be described with reference to FIGS. 1A, 1B, 2A, 2B and 3. FIGS. 1A and 1B are sectional views showing resist patterns for determining a focus deviation amount. FIG. 1A shows an isolated line pattern 1. Lt denotes a top dimension of the line pattern 1, namely, the length of a top surface. Lb denotes a bottom dimension of the line pattern 1, namely, the length of a bottom surface. The isolated line pattern 1 is characterized in that a variation in its cross-sectional shape becomes notable when a focus value at the time of exposure is shifted toward a positive side. FIG. 1B shows an isolated space pattern 2. St denotes a top dimension of the space pattern 2, namely, the length at the top of a space 3. Sb denotes a bottom dimension of the space pattern 2, namely, the length at the bottom of the space 3. The isolated space pattern 2 is characterized in that a variation in its cross-sectional shape becomes notable when the focus value at the time of exposure is shifted toward a negative side.

FIGS. 2A and 2B show variations in normalized edge inclination amounts. In FIGS. 2A and 2B, the horizontal axis indicates a focus value at the time of exposing the patterns shown in FIGS. 1A and 1B, respectively. The vertical axis indicates a normalized edge inclination amount $\Delta Ln$ of the line pattern 1 of FIG. 1A and a normalized edge inclination amount $\Delta Sn$ of the space pattern 2 of FIG. 1B, respectively. The normalized edge inclination amounts $\Delta Ln$ and $\Delta Sn$ are values described below.

First, the edge inclination amount is defined as an amount showing a degree of inclination of end faces of each pattern. In the present embodiment, edge inclination amounts $\Delta L$ and $\Delta S$ are expressed respectively by the difference between the top dimension Lt and the bottom dimension Lb of the line pattern 1 of FIG. 1A and the difference between the top dimension St and the bottom dimension Sb of the space pattern 2 of FIG. 1B (Equations (1) and (2)).

$$\Delta L = Lt - Lb \quad (1)$$

$$\Delta S = St - Sb \quad (2)$$

The normalized edge inclination amounts $\Delta Ln$ and $\Delta Sn$ respectively are values obtained by normalizing the edge inclination amounts $\Delta L$ and $\Delta S$ when exposed in a state where a focus is shifted with respect to edge inclination amounts $\Delta Lo$ and $\Delta So$ at the time of exposure at the best focus value by using Equations (3) and (4).

$$\Delta Ln = (\Delta L - \Delta Lo) \quad (3)$$

$$\Delta Sn = (\Delta S - \Delta So) \quad (4)$$

As shown in FIG. 2A, in the line pattern, the normalized edge inclination amount $\Delta Ln$ varies considerably when the focus value is shifted toward the positive side. On the other hand, in the space pattern, as shown in FIG. 2B, the normalized edge inclination amount $\Delta Sn$ varies considerably when the focus value is shifted toward the negative side.

FIG. 3 shows the dependence of a shift index on a focus variation. With its horizontal axis indicating a focus value and its vertical axis indicating a shift index SI, this figure shows a variation in the shift index SI with respect to the focus variation. Here, the shift index SI is represented by a calculation formula (Equation (5)) obtained by adding together the normalized edge inclination amounts $\Delta Ln$ and $\Delta Sn$ of the line pattern and the space pattern shown in FIGS. 2A and 2B.

$$SI = \Delta Ln + \Delta Sn \quad (5)$$

The edge inclination amount $\Delta L$ of the line pattern varies when the focus value is on the positive side, and the edge inclination amount $\Delta S$ of the space pattern varies when the focus value is on the negative side. Therefore, according to Equation (5), the shift index SI can be monitored even when the focus value is shifted on the positive side or the negative side.

In order to determine the focus deviation amount, the shift index SI is calculated in advance by measuring an isolated line pattern and an isolated space pattern in a lot that has been subjected to exposure. With respect to a lot whose focus deviation amount is to be determined, a deviation amount of the focus value toward the positive side or the negative side at the time of the exposure is calculated based on the obtained SI equation. In this way, it is possible to correct the focus value at the next lot exposure.

In the determination of the focus deviation amount based on the above-described principle, the present invention has been made by improving a method for preparing the shift index SI so that the focus deviation amount near the best focus value can be determined more accurately.

The following is a detailed description of embodiments of the present invention, with reference to the accompanying drawings.

First Embodiment

The method for determining a focus deviation amount in the first embodiment will be described with reference to FIGS. 4 to 9, 10A, 10B, 11 and 12.

Figure 4:
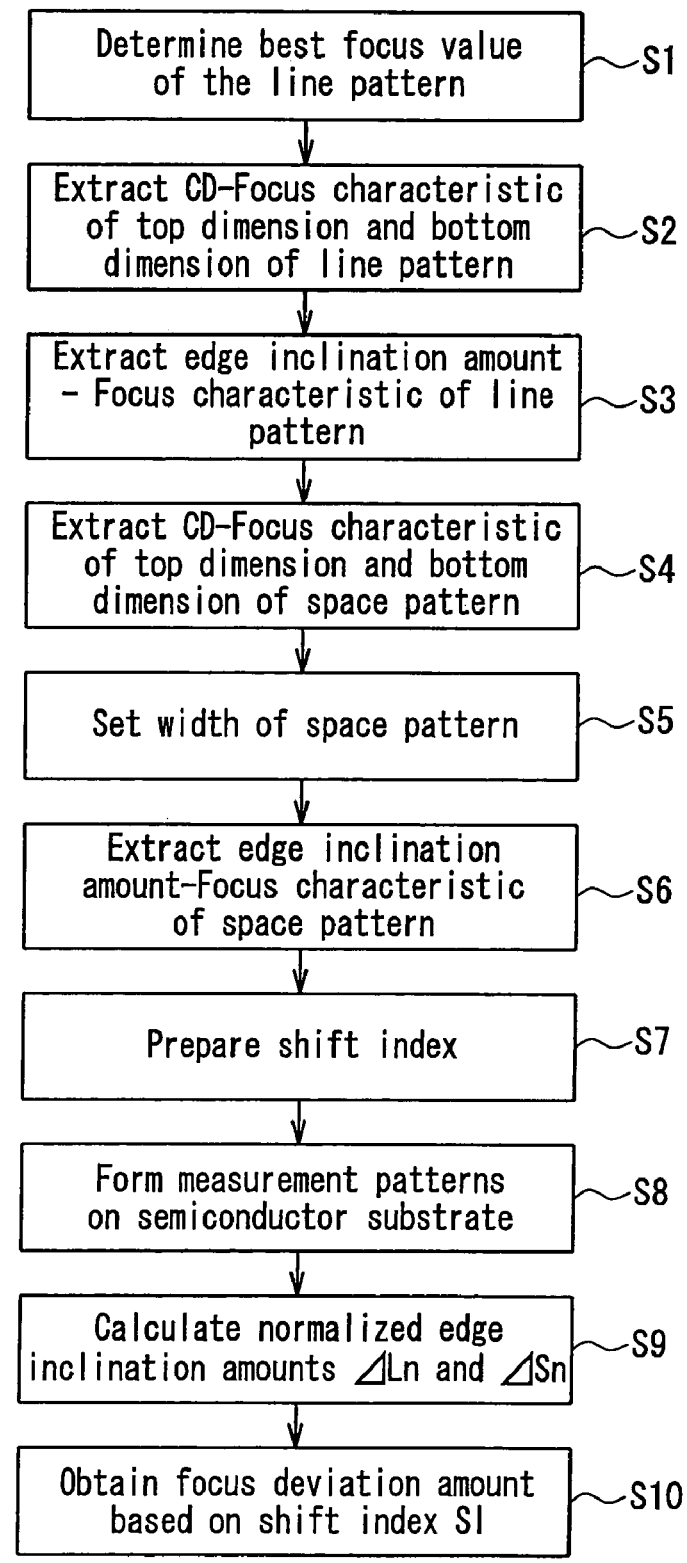
FIG. 4 is a flowchart showing a method for determining a focus deviation amount in a first embodiment.

FIG. 4 is a flowchart showing the method according to the present embodiment. Steps S1 to S7 show a method for extracting a focus dependence of an edge inclination amount expressed as the shift index SI. Steps S8 to S10 show a method for forming resist patterns with which the focus deviation amount is to be determined and calculating the focus deviation amount using the shift index SI. In the following, each of the steps according to the present embodiment will be described.

Step S1

A best focus value Fo of the line pattern is determined. For that purpose, a CD—Focus characteristic, which is the relationship between a CD (critical dimension) and a focus value of an isolated line pattern, is determined. From this characteristic, the best focus value Fo is obtained.

Figure 5:
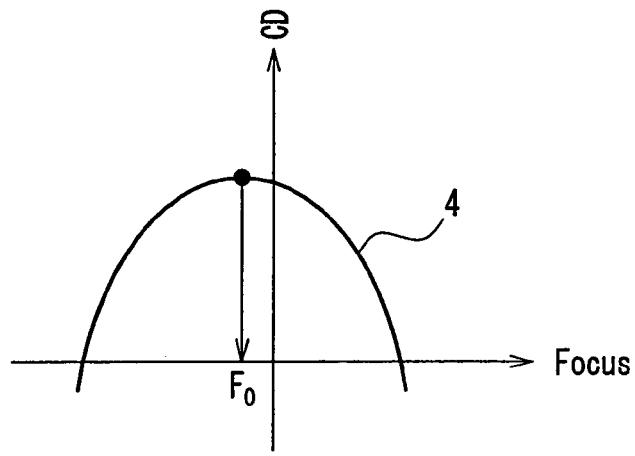
FIG. 5 shows a focus dependence of a line pattern dimension.

First, plural kinds of line patterns are formed by exposures with different focus values, and then the width of the formed patterns is measured. The line pattern used in the present embodiment is an isolated line pattern with a width of 0.18 µm, which is equal to a minimum dimension of a device pattern (a design rule). FIG. 5 shows the relationship between the focus value and the pattern width obtained by the measurement. In FIG. 5, the horizontal axis indicates the focus value at the time of exposure, and the vertical axis indicates the width of the resist pattern of the 0.18 μm isolated line pattern. The focus value Fo when a curve 4 showing the CD—Focus characteristic shown in FIG. 5 is maximal is used as a best focus value. The width of any portion of the resist pattern may be measured for obtaining this CD—Focus characteristic as long as it is a fixed position of the isolated line pattern.

Step S2

Figure 6:
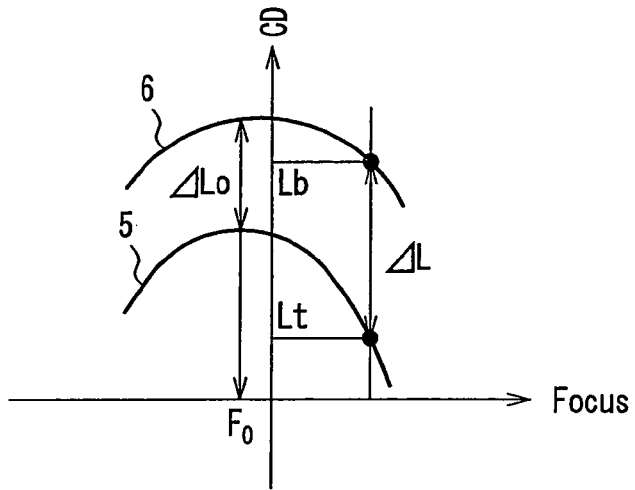
FIG. 6 shows focus dependences of a top dimension and a bottom dimension of the line pattern.

As shown in FIG. 6, the CD—Focus characteristic of the top dimension Lt and the bottom dimension Lb of the line pattern is extracted. For this purpose, plural kinds of line patterns are formed by exposures with different focus values, and then the top dimension Lt and the bottom dimension Lb of the formed line patterns are measured. In FIG. 6, the horizontal axis indicates the focus value, and the vertical axis indicates the dimensions of the formed line pattern. Curves 5 and 6 respectively indicate the variation in the top dimension Lt and the bottom dimension Lb caused by a focus deviation. It can be seen that the difference ΔL between the top dimension Lt and the bottom dimension Lb increases on the positive side and hardly varies on the negative side with respect to the best focus value Fo of this line pattern.

Figure 7:
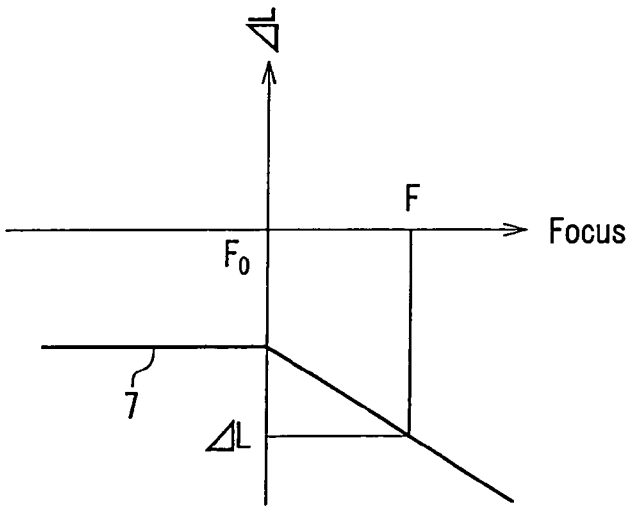
FIG. 7 shows a focus dependence of an edge inclination amount of the line pattern.

Step S3 An edge inclination amount ΔL-Focus characteristic of the line pattern as shown in FIG. 7 is extracted. In FIG. 7, the horizontal axis indicates the focus value F, and the vertical axis indicates the edge inclination amount ΔL(=Lt−Lb) of the line pattern. This FIG. 7 is made using measurement values shown in FIG. 6. In other words, the difference between the top dimension Lt and the bottom dimension Lb at the focus value F in FIG. 6 is obtained and expressed as the edge inclination amount ΔL of the line pattern at the focus value F. The best focus value Fo calculated in FIG. 5 serves as a point of origin of the horizontal axis of FIG. 7. Then, the edge inclination amount ΔL at each focus value is calculated and plotted, thus forming a line 7 shown in FIG. 7.

As becomes evident from FIG. 7, when the focus value is on the negative side, the edge inclination amount ΔL of the line pattern is substantially constant. This is because, as shown in FIG. 6, the curve 5 and the curve 6 tend to vary in a similar manner on the negative side with respect to the best focus value Fo. On the other hand, the curve 5 falls more sharply than the curve 6 on the positive side with respect to the best focus value Fo, so that ΔL increases as the focus value F moves toward the positive side.

Step S4

With respect to the isolated space pattern, the CD—Focus characteristic of the top dimension St and the bottom dimension Sb is extracted. For that purpose, a measurement is taken similarly to the case of extracting the CD—Focus characteristic of the line pattern shown in FIG. 6. However, with respect to a 0.18 μm isolated line pattern, isolated space patterns with plural kinds of widths, for example, 0.20 μm, 0.25 μm and 0.30 μm are produced for measurement.

This is for selecting the width of the space pattern finally so as to bring the best focus value of the space pattern close to the best focus value of the line pattern. In this manner, the problem in the current resist that the best focus values of the line pattern and the space pattern that have equal dimensions are different is avoided, thereby allowing the shift index SI to avoid staying flat near the best focus value.

Figure 8:
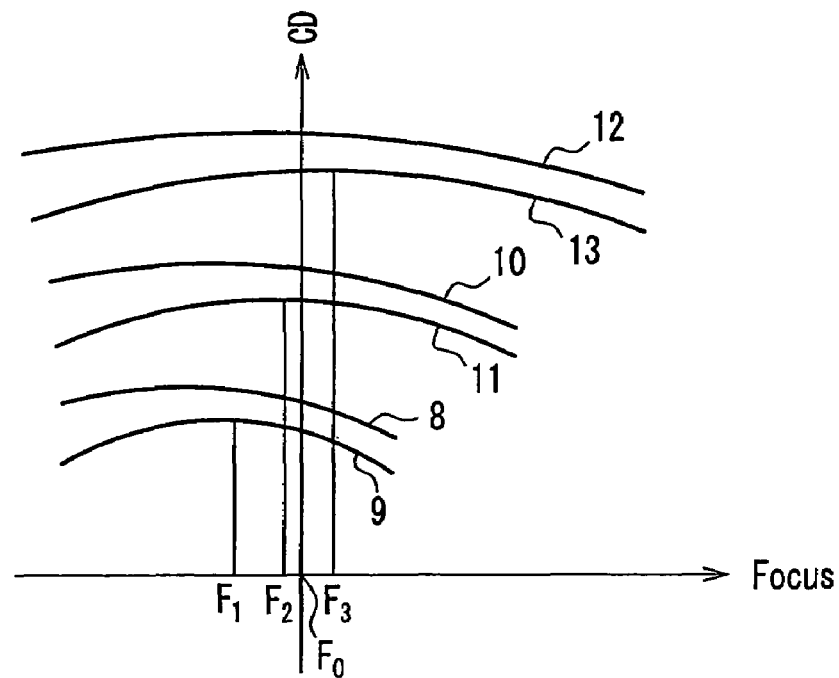
FIG. 8 shows focus dependences of a top dimension and a bottom dimension of each of space patterns having different line widths.

FIG. 8 shows the result of the measurements for the space patterns with respective widths. In FIG. 8, for a comparison with the focus value Fo of the 0.18 μm isolated line pattern, Fo is set as the point of origin. The horizontal axis of FIG. 8 indicates a focus value, and the vertical axis thereof indicates a variation in the top dimension St and the bottom dimension Sb caused by the focus deviation. A curve 8 in FIG. 8 indicates the variation in the top dimension St of the isolated space pattern with a width of 0.20 μm, and a curve 9 indicates the variation in the bottom dimension Sb of this space pattern. A curve 10 indicates the variation in the top dimension St of the isolated space pattern with a width of 0.25 μm, and a curve 11 indicates the variation in the bottom dimension Sb of this space pattern. A curve 12 indicates the variation in the top dimension St of the isolated space pattern with a width of 0.30 μm, and a curve 13 indicates the variation in the bottom dimension Sb of this space pattern. Further, best focus values $F_1$, $F_2$ and $F_3$ of the space patterns with respective widths are shown in the figure. The edge inclination amount ΔS, which is the difference between the top dimension St and the bottom dimension Sb, in the space pattern with each width tends to show the focus dependence opposite to that of the edge inclination amount ΔL in the line pattern. These curves rise on the negative side with respect to their best focus values.

Step S5

Considering the relationship with respect to the best focus value of the line pattern, the width of the space pattern is set to differ from the width of the line pattern. In order to suppress the formation of the flat part in the shift index SI, it is desired that the space pattern should achieve the best focus value at the best focus value Fo of the 0.18 μm line pattern. FIG. 8 indicates that the 0.25 μm space pattern out of the space patterns with respective widths has the best focus value $F_2$ closest to the focus value Fo. Accordingly, it is appropriate to use the 0.25 μm space pattern. In the following steps, the measurement value obtained from the 0.25 μm space pattern will be used.

Step S6

Figure 9:
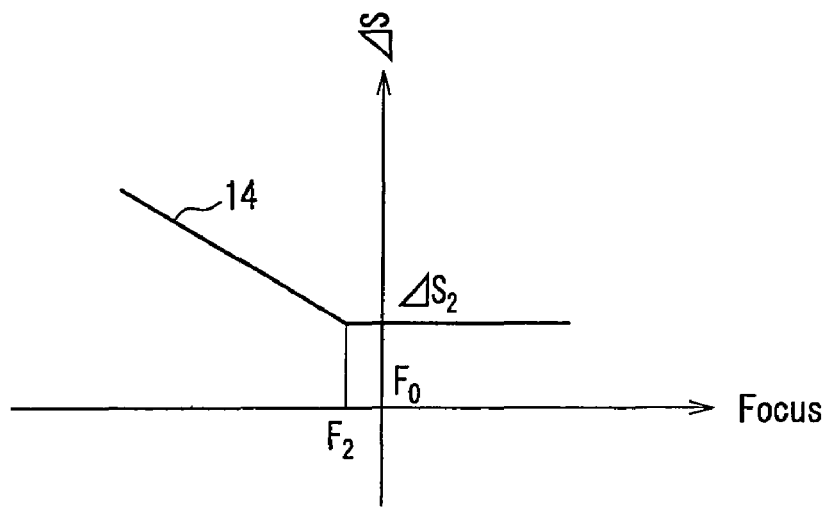
FIG. 9 shows a focus dependence of an edge inclination amount of the space pattern.

Similarly to the edge inclination amount ΔL-Focus characteristic of the line pattern shown in FIG. 7, the edge inclination amount ΔS-Focus characteristic of the space pattern is extracted as shown in FIG. 9. In FIG. 9, the horizontal axis indicates the focus value, and the vertical axis indicates the edge inclination amount ΔS(=St−Sb). As shown in this figure, when the focus value is on the positive side, the edge inclination amount ΔS of the space pattern is substantially constant. This is because, in FIG. 8, the curve 11 and the curve 10 tend to vary in a similar manner on the positive side with respect to the best focus value F2. On the other hand, the curve 11 falls more sharply than the curve 10 on the negative side with respect to the best focus value F2, so that ΔS increases as the focus value F moves toward the negative side.

Step S7

The shift index SI for obtaining the focus deviation amount is prepared based on the edge inclination amounts ΔL and ΔS of the line pattern and the space pattern.

Figure 10A:
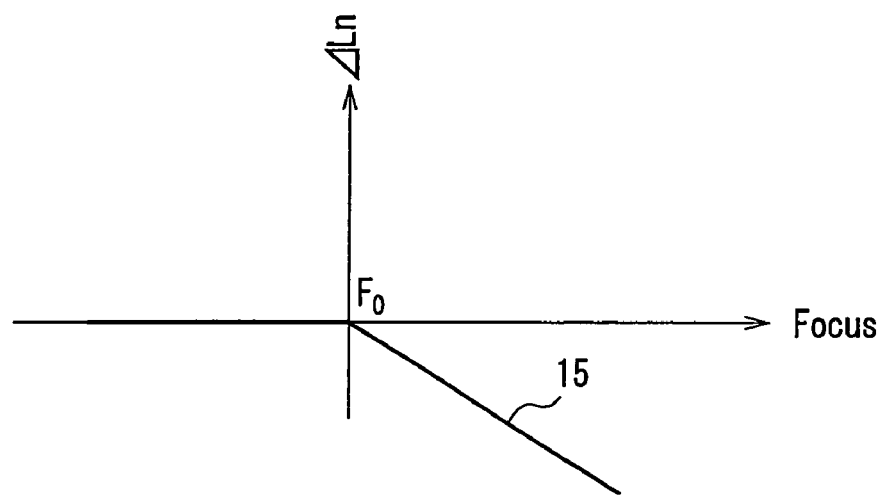
FIGS. 10A and 10B are drawings obtained by normalizing the edge inclination amounts.

First, as shown in FIG. 10A, data of the normalized edge inclination amount ΔLn are formed from the edge inclination amount ΔL of the line pattern. In other words, from the line 7 indicating the focus dependence of the edge inclination amount ΔL of the line pattern shown in FIG. 7 obtained above, a line 15 shown in FIG. 10A is formed by shifting the point of origin to an edge inclination amount ΔLo at the best focus value Fo. That is to say, the line 7 of FIG. 7 is moved in parallel by ΔLo along a Y-axis direction.

Figure 10B:
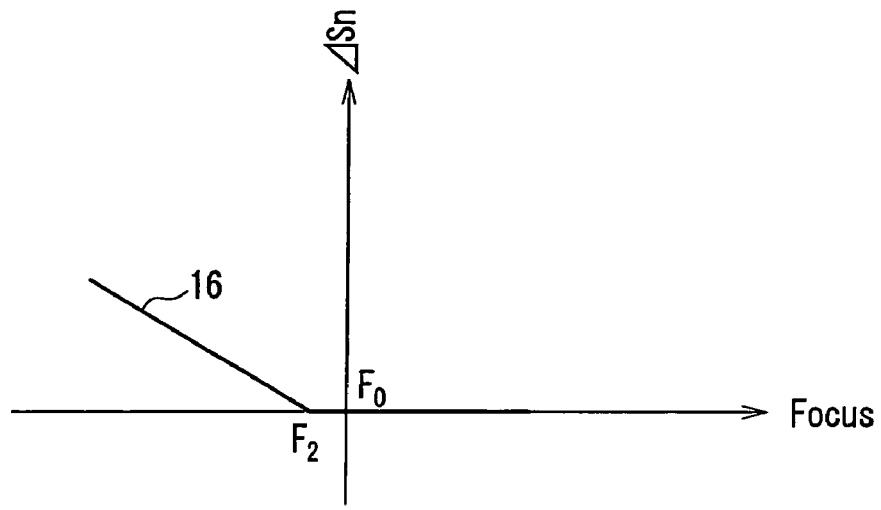

Also, as shown in FIG. 10B, data of the normalized edge inclination amount ΔSn are formed from the edge inclination amount ΔS of the space pattern. In other words, from the line 14 indicating the focus dependence of the edge inclination amount ΔS of the space pattern shown in FIG. 9, a line 16 shown in FIG. 10B is formed by shifting the point of origin to an edge inclination amount ΔS2 at the best focus value F2. That is to say, the line 14 of FIG. 9 is moved in parallel by ΔS2 along the Y-axis direction.

Figure 11:
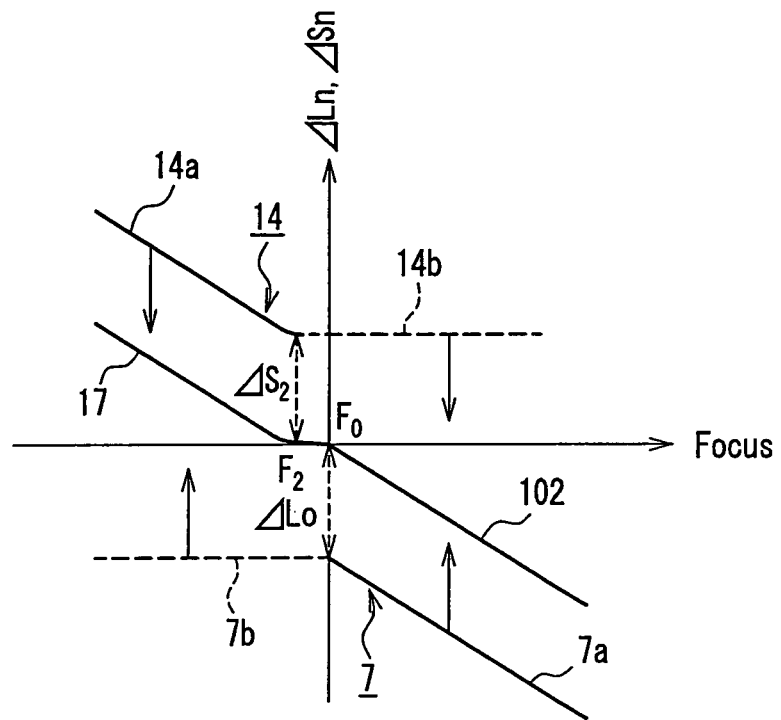
FIG. 11 shows focus dependences of the normalized edge inclination amounts.

Next, the line 15 in FIG. 10A and the line 16 in FIG. 10B that are formed as above are superposed so as to obtain a line 17 indicating the shift index SI in FIG. 11. FIG. 11 is a drawing showing the focus dependence of the normalized edge inclination amounts ΔLn and ΔSn. It is noted that the line 7 in FIG. 7 and the line 14 in FIG. 9 also are superposed and shown in FIG. 11. The line 17 is formed of a line segment 7a of the line 7 located on the positive side of the focus and a line segment 14a of the line 14 located on the negative side of the focus. From a line segment 7b and a line segment 14b, the focus deviation cannot be detected because the edge inclination amount does not vary even when the focus is shifted.

Here, in the line 17 in FIG. 11, a flat part remains in a portion extending from the point of origin Fo toward the focus value F2 on the negative side. This is because the best focus value F2 of the space pattern does not completely match with the best focus value Fo of the line pattern. As this difference between Fo and F2 becomes smaller, the correction can be carried out more accurately. A straight line 18 shown in FIG. 12 indicates the focus dependence of an optimal normalized edge inclination amount passing through Fo. It is desired that the shift index SI should be adjusted to be as close as possible to this straight line 18.

It is desirable that the difference between the best focus values Fo and F2 should be set to be within 0.2 μm practically. It is further preferable that the dimensional relationship between the line pattern and the space pattern is set so that the difference is within 0.1 μm. This range indicates a range in which, by correcting the focus deviation amount based on the formed shift index SI, a resist pattern having practically favorable shape and dimension can be formed.

As described above, the shift index SI showing the focus dependence of the edge inclination amount is formed so that its accuracy near the best focus is enhanced. Based on this shift index SI, it becomes possible to determine the focus deviation amount accurately. The following steps show the method for determining the focus deviation amount at the time of exposure based on the shift index SI formed in the steps described above.

Step S8

In an exposure step in which the focus deviation amount is to be determined, measurement patterns for determining a focus deviation amount are formed on a semiconductor substrate to be processed. As the measurement patterns, the isolated line pattern and the isolated space pattern shown in FIGS. 1A and 1B respectively are formed.

Step S9

With respect to the formed measurement patterns, the top dimension Lt and the bottom dimension Lb of the line pattern and the top dimension St and the bottom dimension Sb of the space pattern are measured. Using the top dimensions Lt and St and bottom dimensions Lb and Sb that have been measured, the edge inclination amount ΔL of the line pattern and the edge inclination amount ΔS of the space pattern are calculated. Subsequently, by subtracting the edge inclination amount ΔLo at the best focus value Fo shown in FIG. 7 from the edge inclination amount ΔL of the line pattern, the normalized edge inclination amount ΔLn is obtained. By subtracting the edge inclination amount ΔS2 at the best focus value F2 shown in FIG. 9 from the edge inclination amount ΔS of the space pattern, the normalized edge inclination amount ΔSn is obtained. Then, the normalized edge inclination amount ΔLn of the line pattern and the normalized edge inclination amount ΔSn of the space pattern are added together, thereby obtaining an SI value of the patterns formed on the semiconductor substrate (Equation (5)).

Step S10

Figure 12:
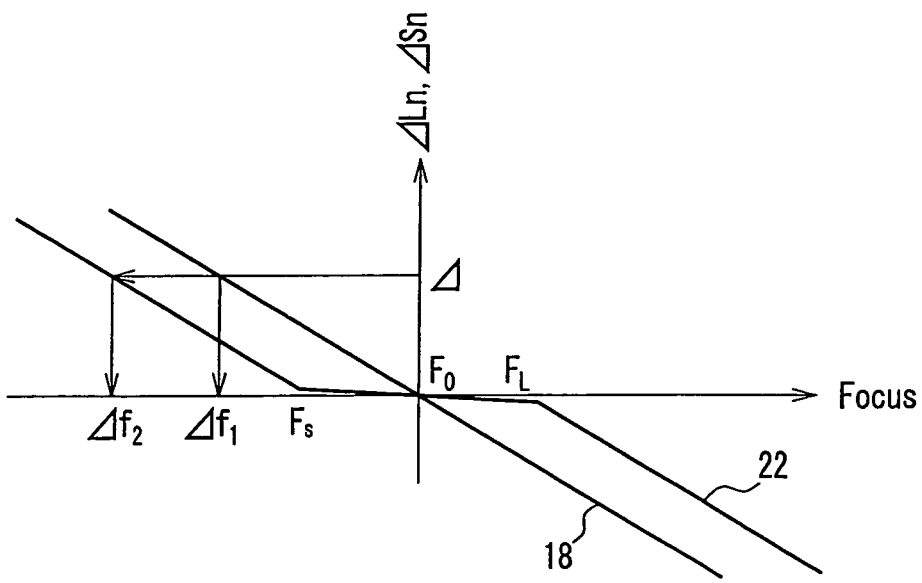
FIG. 12 shows a focus dependence of an optimal normalized edge inclination amount.

The thus obtained shift index value SI is compared with the vertical axis of the SI chart shown in FIG. 12, thereby obtaining the focus value on the horizontal axis corresponding to this SI value. This focus value on the horizontal axis is a focus deviation amount Δfocus.

By correcting this focus deviation amount Δfocus at the next exposure, exposure always can be conducted with the best focus value, making it possible to form a resist pattern with a small dimensional variation and an excellent shape.

Second Embodiment

The method for determining a focus deviation amount in the second embodiment will be described with reference to FIGS. 12, 13, 14A, 14B, 15 to 17.

Figure 13:
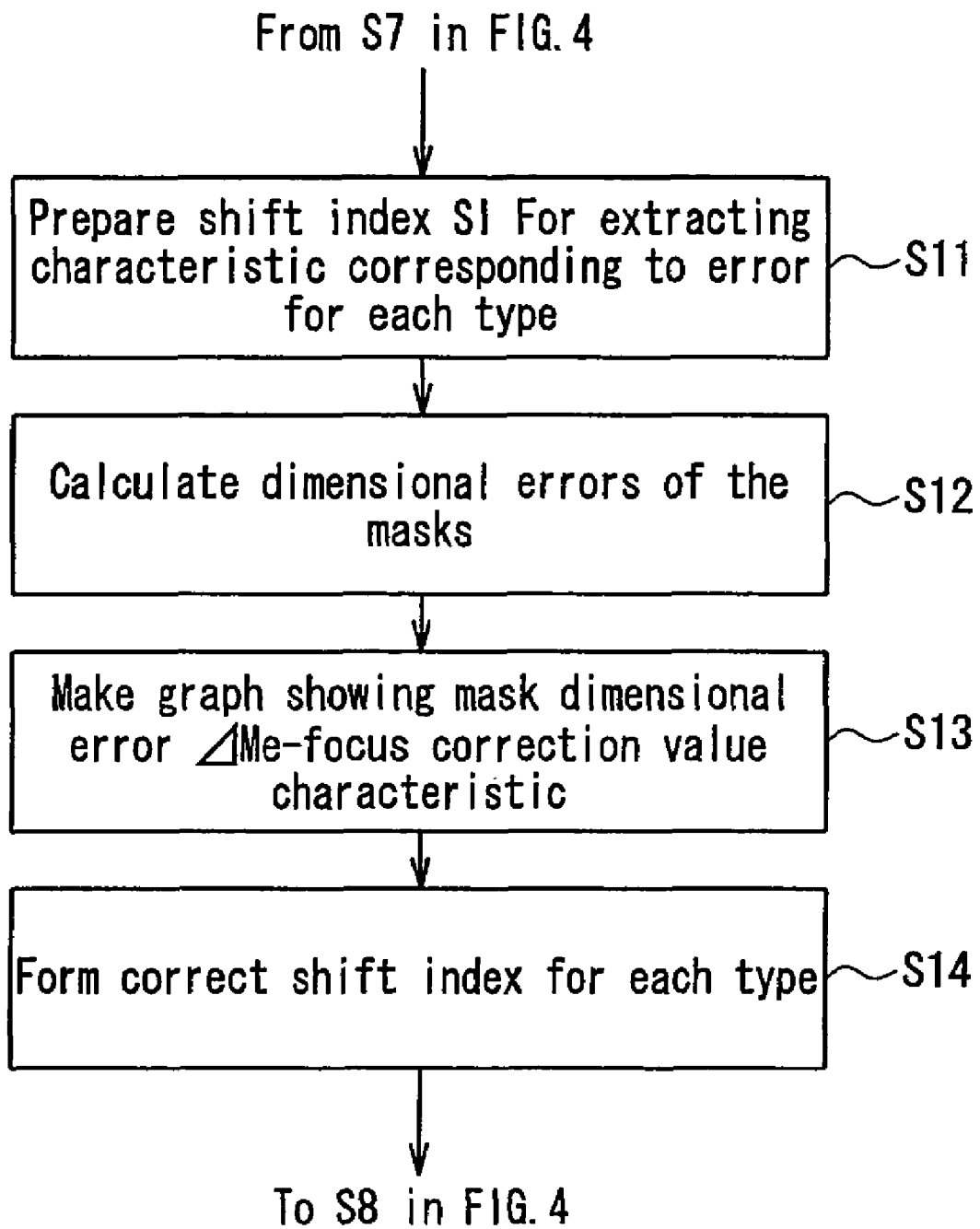
FIG. 13 is a flowchart showing a method for determining a focus deviation amount in a second embodiment.

FIG. 13 is a flowchart showing a main part of the method according to the present embodiment. The method according to the present embodiment has Steps S11 to S14 in the flowchart of FIG. 13 between Steps S1 to S7 and Steps S8 to S10 shown in FIG. 4. This method is characterized by correcting the influence of production errors of masks used for pattern exposure for the purpose of eliminating or reducing the flat part of the line 17 shown in FIG. 11.

Figure 14A:
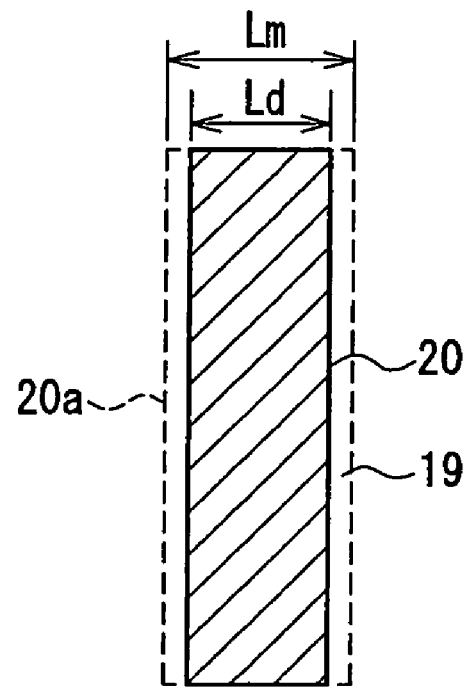
FIGS. 14A and 14B are drawings for describing dimensional errors of masks.
Figure 14B:
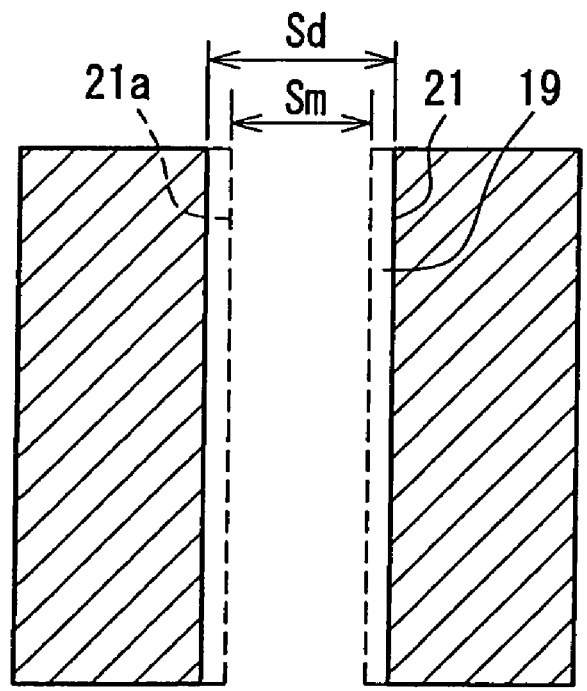

FIGS. 14A and 14B are drawings for describing dimensional errors in manufacturing masks. Ld denotes a design dimension of the mask for the line pattern, and Sd denotes a design dimension of the mask for the space pattern. Lm denotes a measurement value of a finished dimension on the manufactured masks for the line pattern, and Sm denotes that for the space pattern. The dimensional errors of the masks are (Lm−Ld) and (Sm−Sd), respectively.

In the case where a mask dimensional error 19 is 0.005 μm, for example, the finished dimension Lm of a line pattern 20 shown in FIG. 14A becomes wider by 0.01 μm so as to be a line pattern 20a indicated by broken lines. The best focus of this line pattern 20a is shown as $F_L$ in FIG. 12. Also, the finished dimension Sm of a space pattern 21 shown in FIG. 14B becomes narrower by 0.01 μm so as to be a space pattern 21a indicated by broken lines. In this case, the best focus of the space pattern 21a is shown as $F_S$ in FIG. 12. Owing to this deviation of their best focuses, the straight line 18 becomes a line 22. In this case, with respect to a normalized edge inclination amount at a given time of exposure, the focus deviation amount is $\Delta f_1$ according to the shift index shown by the straight line 18, whereas it is $\Delta f_2$, which is different from $\Delta f_1$, according to that shown by the line 22.

In this way, even if the design rule of the line pattern and the space pattern that achieves an equal best focus value is determined by the flow shown in FIG. 4 before manufacturing masks, the dimensional error 19 during the mask manufacture causes the best focus values of the line pattern and the space pattern to be different as shown in FIG. 12. As a result, the flat part is formed, so that the shift index SI capable of making an accurate correction cannot be obtained.

Thus, according to Steps S11 to S14, based on the sum of the mask dimensional error for the line pattern and that of the space pattern, a focus correction value for suppressing the influence of the mask dimensional error is calculated as follows.

Step S11

Figure 15:
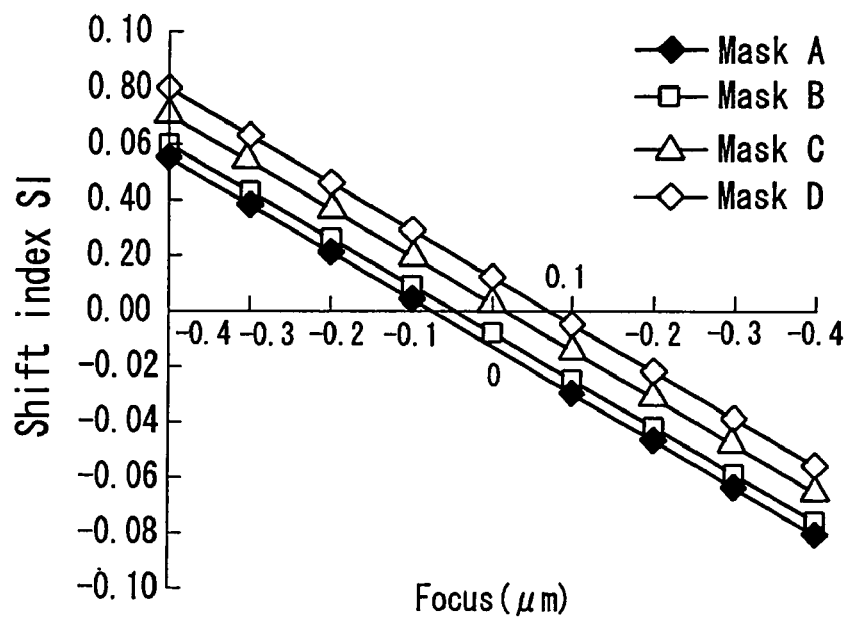
FIG. 15 shows shift indexes of masks of individual types.

First, for each type, a shift index SI for extracting a characteristic corresponding to the error is obtained. The method therefor is as follows: according to Steps S1 to S7 shown in FIG. 4, a mask formed for each type is used for exposure at a plurality of focus values, and then the shift index SI is obtained in a manner similar to that described above. As an example, FIG. 15 shows altogether the shift indexes SI obtained using masks A to D for four types. From this figure, it can be seen that the line of SI is shifted along an X-axis direction due to the dimensional error of the mask of each type.

Step S12

The dimensional errors of the masks used in Step S11 are calculated. First, a mask dimensional error $\Delta ML$ of the line pattern and a mask dimensional error $\Delta MS$ of the space pattern are calculated from the design dimensions Ld and Sd of the masks and the finished dimensions Lm and Sm on the manufactured masks shown in FIGS. 14A and 14B (Equations (6) and (7)).

$$\Delta ML = Lm - Ld \quad (6)$$

$$\Delta MS = Sm - Sd \quad (7)$$

Then, a mask dimensional error $\Delta Me$ is expressed by the sum of the mask dimensional error $\Delta ML$ of the line pattern and the mask dimensional error $\Delta MS$ of the space pattern (Equation (8)).

$$\Delta Me = \Delta ML + \Delta MS \quad (8)$$

As shown in FIG. 15, the mask dimensional error $\Delta Me$ of each type causes a difference in the shift indexes SI. Owing to this difference in the shift indexes SI, the focus deviation amounts calculated from the shift indexes SI differ from each other. Thus, it is necessary to correct the focus deviation amount with respect to the mask dimensional error $\Delta Me$.

Step S13

The calculated value of the mask dimensional error $\Delta Me$ is used to make a graph showing a mask dimensional error $\Delta Me$-focus correction value characteristic.

Figure 16:
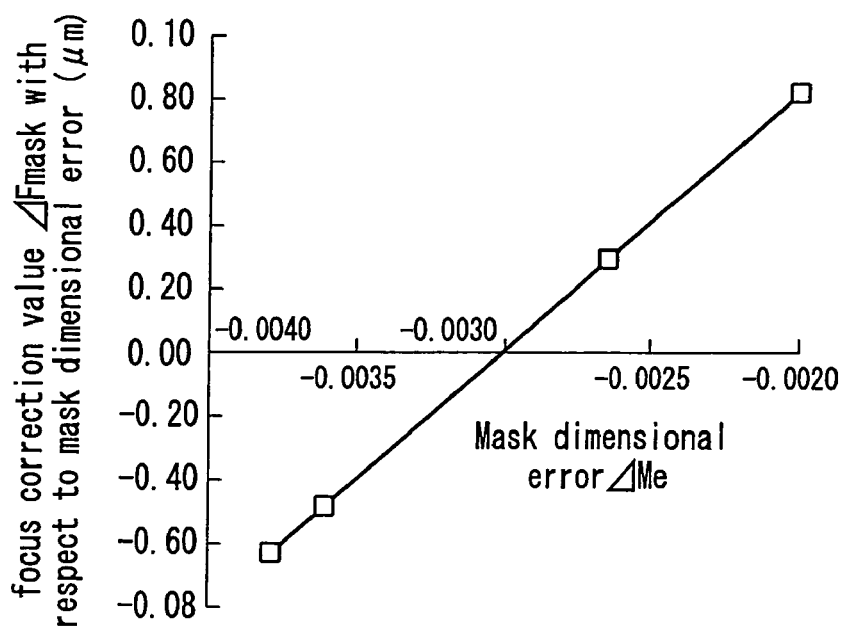
FIG. 16 shows a focus correction value with respect to the dimensional error of the mask.

In order to obtain a correction value of the focus deviation amount with respect to the mask dimensional error $\Delta Me$, a focus correction value $\Delta Fmask$ is calculated based on the values of the mask dimensional errors $\Delta Me$ of the masks A to D and the shift indexes SI obtained for these masks. FIG. 16 shows the characteristic of the focus correction value $\Delta Fmask$ with respect to the mask dimensional error $\Delta Me$ that has been extracted from the measurement values for the masks A to D. The horizontal axis indicates the mask dimensional error, and the vertical axis indicates the focus correction value $\Delta Fmask$.

Step S14

Figure 17:
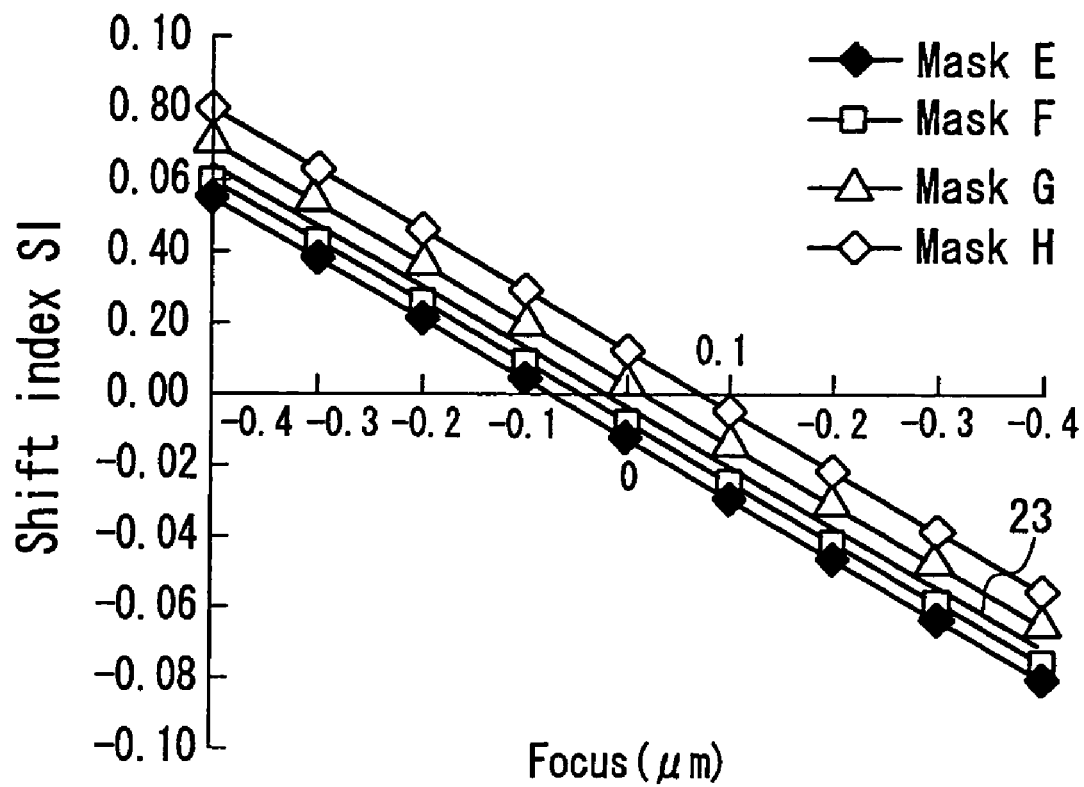
FIG. 17 shows corrected shift indexes.

The shift index SI in which the mask dimensional error is corrected is formed for each type. First, the mask dimensional error $\Delta Me$ is calculated for each type. Then, based on the characteristic of the focus correction value $\Delta Fmask$ shown in FIG. 16, the calculated mask dimensional error $\Delta Me$ is used for obtaining a focus deviation amount correction value $\Delta Fmask$ specific for each type. Thereafter, a straight line 23, which is a shift index passing through the point of origin, shown in FIG. 17 is shifted by $\Delta Fmask$ along the X direction, thereby forming corrected shift indexes SI for the respective types (masks E to H).

By providing feedback on the final correction value from the corrected shift index SI formed for each type as described above to the condition for exposure, it becomes possible to carry out still more accurate focus correction.

Third Embodiment

The pattern exposure method according to the third embodiment will be described referring to FIGS. 18A to 18F, which are sectional views showing steps thereof The exposure method according to the present embodiment is a method for forming a resist pattern with a small dimensional variation and an excellent shape by using the shift index SI determined by the method described in the above embodiments.

Figure 18A:
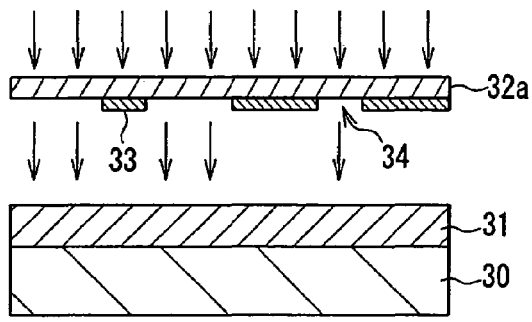
FIGS. 18A to 18F are sectional views showing steps of a pattern exposure method in a third embodiment.
Figure 18B:
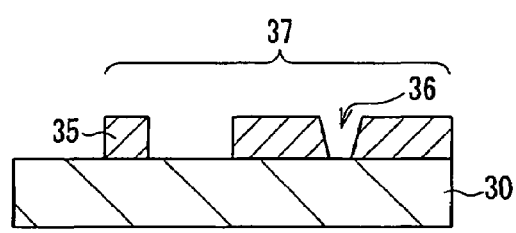

First, as shown in FIG. 18A, a pattern exposure is carried out for a resist film 31 formed on a first semiconductor substrate 30. A mask 32a for exposure is provided with an isolated line pattern 33 and an isolated space pattern 34 for determining a focus deviation amount. The exposure using this mask 32a followed by development forms a first measurement pattern 37 including an isolated line pattern 35 and an isolated space pattern 36 shown in FIG. 18B.

Although this figure illustrates only one set of the measurement pattern 37, plural sets of the measurement patterns 37 are formed in practice by carrying out the exposure with plural focus values as data shown in FIGS. 2A and 2B. For example, by carrying out the exposure with eleven focus values from −0.5 µm to +0.5 µm with a pitch of 0.1 µm, eleven sets of the measurement patterns are formed. These first measurement patterns 37 may be formed on a single semiconductor substrate or plural semiconductor substrates.

Next, the first measurement pattern 37 is measured, thus making the SI chart as shown in FIG. 11 by the method described in the above embodiments.

Figure 18C:
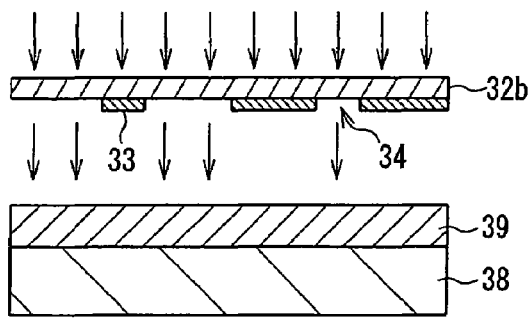
Figure 18D:
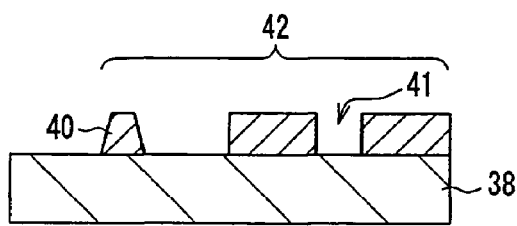

Subsequently, as shown in FIG. 18C, pattern exposure is carried out for a resist film 39 formed on a second semiconductor substrate 38 with a predetermined focus value. A mask 32b for exposure is provided with the isolated line pattern 33 and the isolated space pattern 34 for determining a focus deviation amount. The development thereafter forms a second measurement pattern 42 including an isolated line pattern 40 and an isolated space pattern 41 as shown in FIG. 18D. The measurement pattern is formed in this step for the purpose of monitoring a slight deviation of the focus value at the time of exposure caused by a process variation by using the SI chart.

Next, the top dimensions Lt and St and the bottom dimensions Lb and Sb of the line pattern 40 and the space pattern 41 are measured. Subsequently, using the top dimensions Lt and St and the bottom dimensions Lb and Sb, the edge inclination amount $\Delta L$ of the line pattern and the edge inclination amount $\Delta S$ of the space pattern are calculated. Then, as described referring to FIGS. 10A and 10B, these edge inclination amounts are normalized to obtain $\Delta Ln$ and $\Delta Sn$. Thereafter, the SI value is calculated.

Next, by the method illustrated by FIG. 12, from the resultant SI value and the SI chart made in the above-described step, a deviation amount $\Delta$focus from a desired focus at the time of exposure in this step is calculated.

Figure 18E:
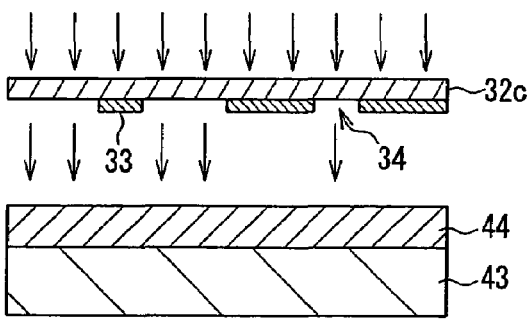
Figure 18F:
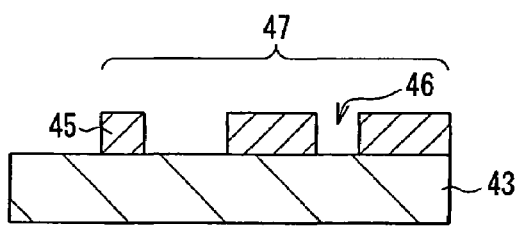
Figure 21:
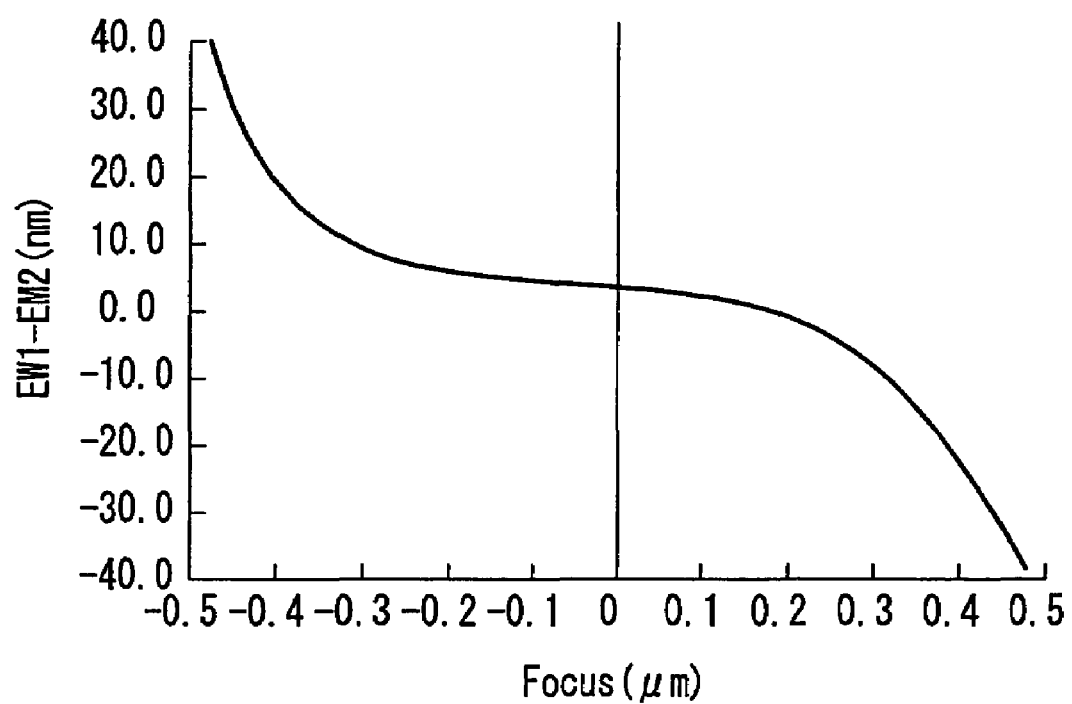
FIG. 21 shows a conventional model of a focus variation.

Thereafter, the obtained deviation amount $\Delta$focus of the focus value is used to make the correction at the time of setting the focus for the next exposure. In other words, as shown in FIG. 18E, a pattern exposure with the corrected focus value is carried out for a resist film 44 formed on a third semiconductor substrate 43. In this step, a mask 32c for exposure also is provided with the isolated line pattern 33 and the isolated space pattern 34 for determining a focus deviation amount. The development thereafter forms a third measurement pattern 47 including an isolated line pattern 45 and an isolated space pattern 46 as shown in FIG. 18F. Similarly to the previous step, the measurement pattern is formed in this step for the purpose of monitoring a slight deviation of the focus value at the time of exposure caused by a process variation by using the SI chart. By measuring the edge inclination amount of the measurement pattern 47, it is possible to calculate the focus deviation amount, thus suppressing the focus deviation at the next exposure.

Although the width of the space pattern has been adjusted so that the best focus value of the space pattern is brought closer to the best focus value of the line pattern with a desired line width in the embodiments described above, the adjustment also can be made in a reversed manner. In other words, the line width of the line pattern also may be adjusted so that the best focus value of the line pattern is brought closer to the best focus value of the space pattern with a desired width.

Furthermore, a configuration similar to that described above also may be achieved by using one or more dot patterns instead of the line pattern and using one or more hole patterns instead of the space pattern. This is because the dot pattern and the hole pattern vary in their top dimension and bottom dimension with the focus variation regardless of the pattern density, making it possible to monitor the focus deviation. In this case, the top dimension and the bottom dimension of the dot pattern and the hole pattern may be the dimension of their diameter, for example.

INDUSTRIAL APPLICABILITY

According to the present invention, it is possible to raise the accuracy of determining the focus deviation amount in pattern exposure in lithography, thereby forming a minute resist pattern accurately.

The invention claimed is:

1. A method for determining a focus deviation amount, comprising:
    forming on a first substrate a plurality of first measurement patterns, each including a protruding pattern with a predetermined shape formed of a resist film and a recessed pattern having adjacent patterns of the resist film with a space provided therebetween, the plurality of first measurement patterns having different focus values at a time of exposure;
    measuring edge inclination amounts of the protruding pattern and the recessed pattern in the plurality of first measurement patterns;
    obtaining a focus dependence of the edge inclination amounts, which is a characteristic showing how the edge inclination amounts vary with respect to a variation in the focus value at the time of exposure, based on correspondences between the measured edge inclination amounts and the focus values;
    forming on a second substrate a second measurement pattern including the protruding pattern and the recessed pattern so as to measure edge inclination amounts of the protruding pattern and the recessed pattern in the second measurement pattern; and
    calculating a focus deviation amount deviating from a best focus at the time of exposure of the second measurement pattern from the edge inclination amounts measured with respect to the second measurement pattern based on the focus dependence of the edge inclination amounts;
    wherein a design value of a width of the predetermined shape of the protruding pattern and a design value of a width of the space of the recessed pattern are set so that best focus values at the time of exposing the protruding pattern and the recessed pattern become closer.

2. The method for determining a focus deviation amount according to claim 1, wherein normalized edge inclination amounts are obtained respectively for the protruding pattern and the recessed pattern in the plurality of first measurement patterns by subtracting values of the edge inclination amounts at the best focus values from values of the edge inclination amounts at the respective focus values,
    the normalized edge inclination amounts obtained for the protruding pattern and the recessed pattern are combined to prepare a shift index showing a correspondence with the focus value at the time of exposure, and
    the shift index is used as the focus dependence of the edge inclination amounts.

3. The method for determining a focus deviation amount according to claim 2, wherein the shift index is modified by correcting a shift of the correspondence between the normalized edge inclination amounts and the focus value at the time of exposure caused by a dimensional error of an exposure mask for forming the protruding pattern and the recessed pattern with respect to a design value.

4. The method for determining a focus deviation amount according to claim 1, wherein a line pattern formed of the resist film remaining in a linear form is used as the protruding pattern, and a space pattern having a space remaining after removing the resist film in a linear form is used as the recessed pattern.

5. The method for determining a focus deviation amount according to claim 1, wherein a dot pattern formed of the resist film remaining in a dotted form is used as the protruding pattern, and a hole pattern having a space remaining after removing the resist film in a dotted form is used as the recessed pattern.

6. The method for determining a focus deviation amount according to claim 1, wherein the edge inclination amounts are measured by measuring a top dimension, which is a dimension at a top surface position of the resist film, and a bottom dimension, which is a dimension at a bottom surface position thereof, and calculating a difference between the top dimension and the bottom dimension for each of the protruding pattern and the recessed pattern.

7. The method for determining a focus deviation amount according to claim 1, wherein a dimensional relationship between the protruding pattern and the recessed pattern is set so that the difference between the best focus values at the time of exposing the protruding pattern and the recessed pattern is within 0.2 μm.

8. The method for determining a focus deviation amount according to claim 7, wherein the dimensional relationship between the protruding pattern and the recessed pattern is set so that the difference between the best focus values at the time of exposing the protruding pattern and the recessed pattern is within 0.1 μm.

9. A method for extracting a focus dependence of an edge inclination amount, comprising:
    forming on a substrate a plurality of measurement patterns, each including a protruding pattern with a predetermined shape formed of a resist film and a recessed pattern having adjacent patterns of the resist film a space provided therebetween, the plurality of measurement patterns having different focus values at a time of exposure;
    measuring edge inclination amounts of the protruding pattern and the recessed pattern in the plurality of measurement patterns; and
    obtaining a focus dependence of the edge inclination amounts, which is a characteristic showing how the edge inclination amounts vary with respect to a variation in the focus value at the time of exposure, based on correspondences between the measured edge inclination amounts and the focus values;
    wherein a design value of a width of the predetermined shape of the protruding pattern and a design value of a width of the space of the recessed pattern are set so that best focus values at the time of exposing the protruding pattern and the recessed pattern become closer.

10. The method for extracting a focus dependence of an edge inclination amount according to claim 9, wherein a line pattern formed of the resist film remaining in a linear form is used as the protruding pattern, and a space pattern having a space remaining after removing the resist film in a linear form is used as the recessed pattern.

11. The method for extracting a focus dependence of an edge inclination amount according to claim 9, wherein a dot pattern formed of the resist film remaining in a dotted form is used as the protruding pattern, and a hole pattern having a space remaining after removing the resist film in a dotted form is used as the recessed pattern.

12. The method for extracting a focus dependence of an edge inclination amount according to claim 9, wherein the edge inclination amounts are measured by measuring a top dimension, which is a dimension at a top surface position of the resist film, and a bottom dimension, which is a dimension at a bottom surface position thereof, and calculating a difference between the top dimension and the bottom dimension for each of the protruding pattern and the recessed pattern.

13. The method for extracting a focus dependence of an edge inclination amount according to claim 9, wherein a dimensional relationship between the protruding pattern and the recessed pattern is set so that the difference between the best focus values at the time of exposing the protruding pattern and the recessed pattern is within 0.2 μm.

14. The method for extracting a focus dependence of an edge inclination amount according to claim 13, wherein the dimensional relationship between the protruding pattern and the recessed pattern is set so that the difference between the best focus values at the time of exposing the protruding pattern and the recessed pattern is within 0.1 μm.

15. A pattern exposure method, comprising:
forming on a first substrate a plurality of first measurement patterns, each including a protruding pattern with a predetermined shape formed of a resist film and a recessed pattern having adjacent patterns of the resist film with a space provided therebetween, the plurality of first measurement patterns having different focus values at a time of exposure;
measuring edge inclination amounts of the protruding pattern and the recessed pattern in the plurality of first measurement patterns;
obtaining a focus dependence of the edge inclination amounts, which is a characteristic showing how the edge inclination amounts vary with respect to a variation in the focus value at the time of exposure, based on correspondences between the measured edge inclination amounts and the focus values;
forming on a second substrate a second measurement pattern including the protruding pattern and the recessed pattern at predetermined focus values so as to measure edge inclination amounts of the protruding pattern and the recessed pattern in the second measurement pattern;
calculating a focus deviation amount deviating from a best focus at the time of exposure of the second measurement pattern from the edge inclination amounts measured with respect to the second measurement pattern based on the focus dependence of the edge inclination amounts; and
performing a pattern exposure with respect to a resist film on a third substrate at a focus value obtained by correcting the calculated focus deviation amount;
wherein a design value of a width of the predetermined shape of the protruding pattern and a design value of a width of the space of the recessed pattern are set so that best focus values at the time of exposing the protruding pattern and the recessed pattern become closer.

16. The pattern exposure method according to claim 15, wherein normalized edge inclination amounts are obtained respectively for the protruding pattern and the recessed pattern in the plurality of first measurement patterns by subtracting values of the edge inclination amounts at the best focus values from values of the edge inclination amounts at the respective focus values,
the normalized edge inclination amounts obtained for the protruding pattern and the recessed pattern are combined to prepare a shift index showing a correspondence with the focus value at the time of exposure, and
the shift index is used as the focus dependence of the edge inclination amounts.

17. The pattern exposure method according to claim 16, wherein the shift index is modified by correcting a shift of the correspondence between the normalized edge inclination amounts and the focus value at the time of exposure caused by a dimensional error of an exposure mask for forming the protruding pattern and the recessed pattern with respect to a design value.

18. The pattern exposure method according to claim 15, wherein a line pattern formed of the resist film remaining in a linear form is used as the protruding pattern, and a space pattern having a space remaining after removing the resist film in a linear form is used as the recessed pattern.

19. The pattern exposure method according to claim 15, wherein a dot pattern formed of the resist film remaining in a dotted form is used as the protruding pattern, and a hole pattern having a space remaining after removing the resist film in a dotted form is used as the recessed pattern.

20. The pattern exposure method according to claim 15, wherein the edge inclination amounts are measured by measuring a top dimension, which is a dimension at a top surface position of the resist film, and a bottom dimension, which is a dimension at a bottom surface position thereof, and calculating a difference between the top dimension and the bottom dimension for each of the protruding pattern and the recessed pattern.

21. The pattern exposure method according to claim 15, wherein a dimensional relationship between the protruding pattern and the recessed pattern is set so that the difference between the best focus values at the time of exposing the protruding pattern and the recessed pattern is within 0.2 μm.

22. The pattern exposure method according to claim 21, wherein the dimensional relationship between the protruding pattern and the recessed pattern is set so that the difference between the best focus values at the time of exposing the protruding pattern and the recessed pattern is within 0.1 μm.

* * * * *